(12) United States Patent
Kim (10) Patent No.: US 6,300,928 B1
(45) Date of Patent: *Oct. 9, 2001

(54) SCANNING CIRCUIT FOR DRIVING LIQUID CRYSTAL DISPLAY (75) Inventor: Young Dae Kim, Anyang-si (KR)

(73) Assignee: LG Electronics Inc., Seoul (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/112,208

(22) Filed: Jul. 9, 1998

(30) Foreign Application Priority Data

Aug. 9, 1997 (KR) .................................. 97-38095

(51) Int. Cl.[7] ...................................... G09G 3/36
(52) U.S. Cl. ................................ 345/92; 98/100
(58) Field of Search ................. 345/92, 90, 98, 345/100, 204, 197, 58; 377/75, 64, 78–79

(56) References Cited

U.S. PATENT DOCUMENTS

| | | | |
|---|---|---|---|
| 5,410,583 | 4/1995 | Weisbrod et al. | 377/75 |
| 5,434,899 * | 7/1995 | Huq et al. | 377/78 |
| 5,510,805 | 4/1996 | Lee | 345/58 |
| 5,701,136 * | 12/1997 | Huq et al. | 345/100 |
| 5,859,630 * | 1/1999 | Huq | 345/100 |

* cited by examiner

Primary Examiner—Richard Hjerpe
Assistant Examiner—Frances Nguyen
(74) Attorney, Agent, or Firm—Morgan, Lewis & Bockius LLP (57) ABSTRACT A scanning circuit that can minimize the number of input signals and switch signals applied to row lines of a liquid crystal panel, and reduce deterioration of a circuit is disclosed. The circuit includes input signal lines and a plurality of substantially identical stages cascade-connected to the input signal lines to produce a plurality of phase delayed scanning signals. Each stage has an input terminal and an output terminal. Also, each stage is provided with output circuitry comprising a push-pull amplifier including pull-up and pull-down transistors having respective conduction paths connected in series with the output terminal thereof and respective control electrodes, the push-pull amplifier having a supply terminal for applying one of the phase delayed scanning signals, input circuitry responsive to scanning pulse applied to the input terminal for generating first and second control signals which are coupled to the control electrodes of the pull-up and pull-down transistors for conditioning the push-pull amplifier to provide output scanning pulses, and means for raising a voltage of the first control signal to be applied to the control electrode of the pull-up transistor.

26 Claims, 11 Drawing Sheets

SCANNING CIRCUIT FOR DRIVING LIQUID CRYSTAL DISPLAY

BACKGROUND OF THE INVENTION

1. Field of the Invention

This invention relates to a driving circuit for an active matrix display device, and more particularly to a scanning circuit for driving the pixel rows of a liquid crystal display device.

2. Description of the Prior Art

Generally, a conventional liquid crystal display (LCD) used for a display device of a television or a computer includes a matrix of liquid crystal cells that are arranged at the crossovers of data lines and select lines. The select lines are sequentially selected by a select line scanner to produce the horizontal lines of the display. The data lines apply the brightness (gray scale) signals to the columns of liquid crystal cells as the select lines are sequentially selected.

Preferably, the select line scanner, which selects the horizontal lines to be displayed, is fabricated directly onto the same substrate and at the same time as the liquid crystal cells. Also, since a large number of data select lines are required for a television or computer display, and the small pixel pitch limits the space available for laying out the driver circuitry, it is essential to keep the select line scanner as simple as possible.

Figure 1:
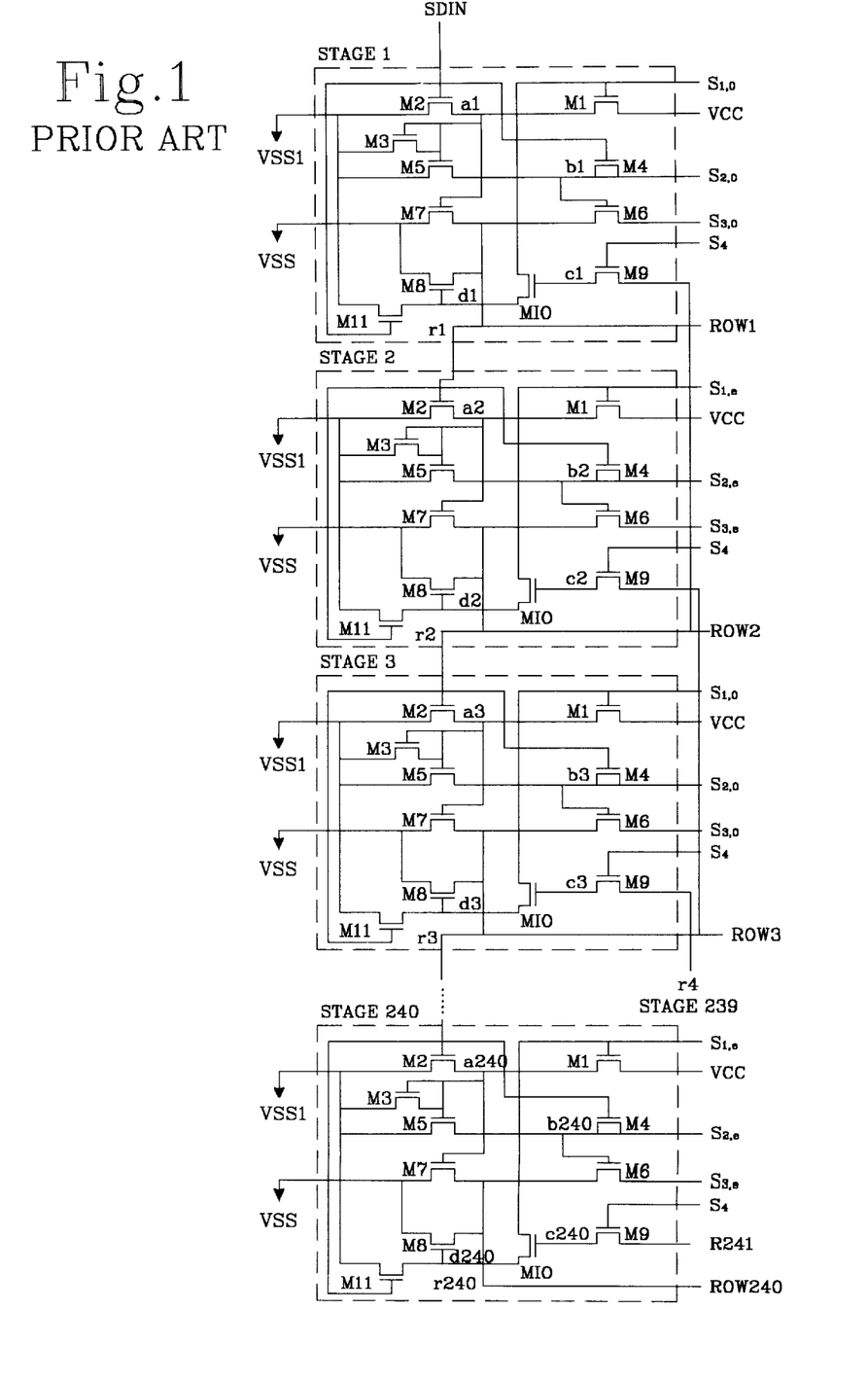
FIG. 1 is a circuit diagram showing a conventional select line scanner.

FIG. 1 illustrates an example of a known select line scanner as described in U.S. Pat. No. 5,510,805, issued to Sywe N. Lee. This select line scanner includes 240 select line driver stages, r1 to r240, which are cascade-connected to each other and simultaneously connected to 240 row lines, ROW 1 to ROW 240, respectively.

Each select line driver stage r1 to r240 includes a transistor M6 for connecting a row line ROW i to a power supply VCC, and two transistors M7 and M8 for connecting a row line ROW i to a first ground VSS. The transistor M6 is turned off by two transistors M3 and MS after being turned on by a transistor M4. The transistor M7 is turned on when a transistor M1 is turned on and is turned off when a transistor M2 is turned on. Similarly, the two transistors M3 and M5 are turned on when the transistor M1 is turned on and are turned off when the transistor M2 is turned on. Further, the transistor M8 is turned on by two transistors M9 and M10 and is turned off by the transistor M1.

Next, each select line driver stage requires voltage signals on adjacent row lines ROW i−1 and ROW i+1, seven control/clock signals $S_{1,0}$ to $S_{3,0}$, $S_{1,e}$ to $S_{3,e}$, and $S_4$, two ground (i.e., negative(−)) voltage sources, VSS and VSS1, and a single supply (i.e., positive(+)) voltage source, VCC. The scanner also allows the voltage signal on the row lines ROW i to stably maintain a low logic state during an interval at which the first clock signal remains at a high logic state.

The conventional select line scanner disclosed in U.S. Pat. No. 5,510,805 has several disadvantages. One disadvantage is that the select line scanner requires numerous clock signals. Another disadvantage is that it requires many voltage signals on adjacent row lines and lengthens the rising time of the voltage signal on each row line. Further, since the select line scanner applies a high logic of voltage signal to two row lines simultaneously during a particular time interval, it may discharge a data signal charged into liquid crystal cells. Also, since each select line driver stage includes a relatively large number of transistors, the circuit configuration of the select line scanner is complicated.

Figure 2:
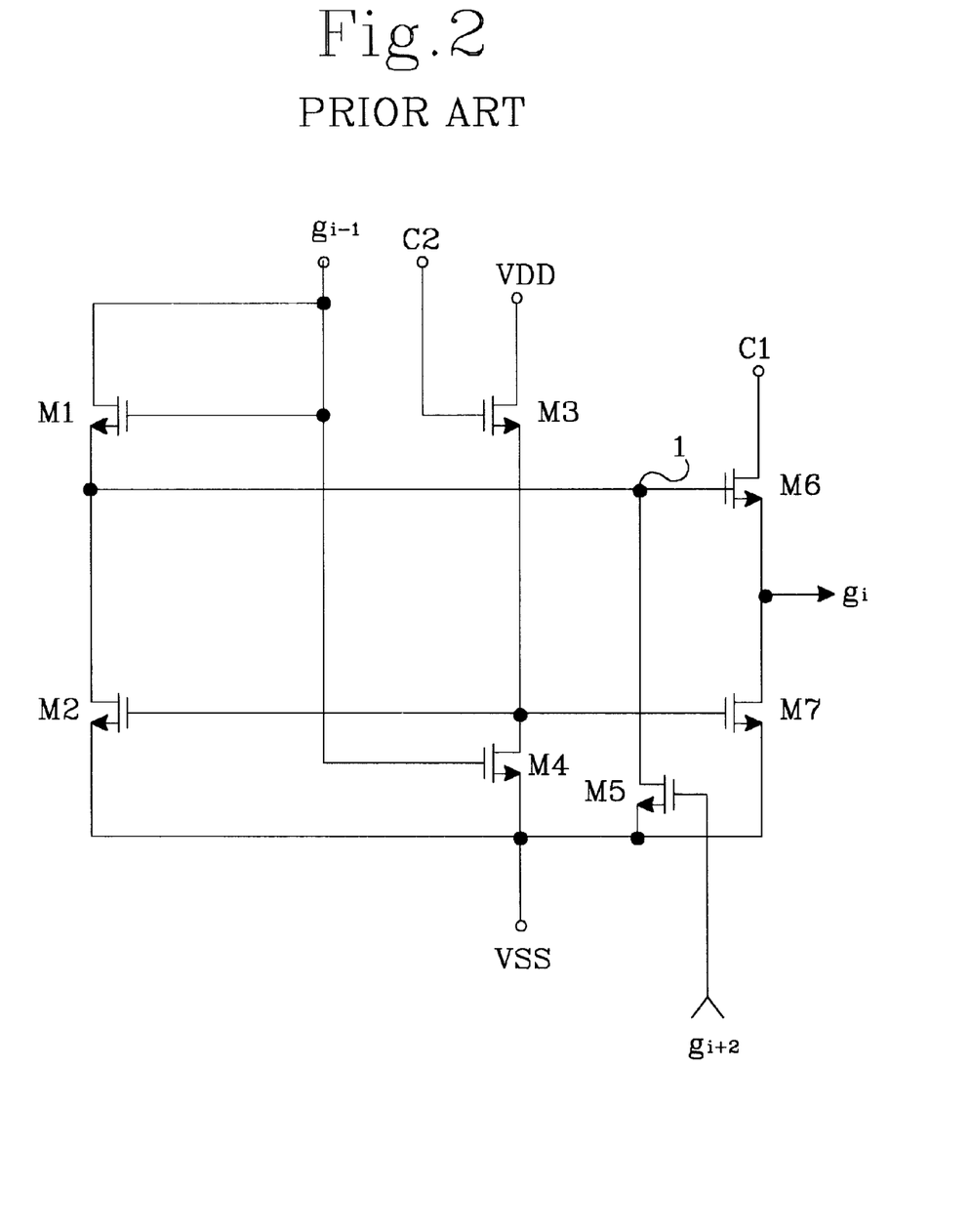
FIG. 2 is a circuit diagram showing a conventional shift register stage.

A conventional shift register stage is shown in FIG. 2. The select line driver stage shown is described in U.S. Pat. No. 5,410,583, issued to Sherman Weisbrod, et al. While this shift register stage has a simpler configuration and fewer clock signals than the select line driver stage shown in FIG. 1, it still has its disadvantages.

This conventional shift register stage includes a pull-up transistor M6 for applying a high logic of voltage signal to row line ROW i, and a pull-down transistor M7 for applying a low logic of voltage signal to row line ROW i. The pull-up transistor M6 is turned on by a high level of the (i−1) row line signal $g_{i-1}$ charged, via a transistor M1, into its gate, and allows a high level of a first clock signal C1 applied to its drain to be supplied to an (i) number row line. Then, the pull-up transistor M6 is turned off by a ground voltage VSS supplied via a transistor M5, to its gate when the (i+2) row line signal $g_{i+2}$ is enabled into a high level state. At this time, the transistor M5 is turned on by the high level of the (i+2) row line signal $g_{i+2}$ to discharge a voltage signal charged into the gate of the pull-up transistor M6 and into the ground VSS.

In this particular shift register stage, a supply voltage VDD is commonly applied, via a transistor M3, to the drain of transistor M4, the gates of transistor M2, and the pull-down transistor M7 during an interval at which the second clock signal C2 is enabled into a high level state. At this time, the pull-down transistor M7 is turned on by a supply voltage VDD applied, via transistor M3, to its gate, thereby discharging a voltage charged onto an (i) row line ROW i into ground VSS. Also, a transistor M2, whose gate is supplied with the supply voltage VDD by way of the transistor M3, is turned on, thereby discharging a voltage charged to the gate of the pull-up transistor M6 into ground VSS.

Meanwhile, transistor M4 is turned on when a high level of the (i−1) row line signal $g_{i-1}$ is applied to its gate, thereby discharging a voltage charged to the gates of the pull-down transistor M7 and transistor M2 into the ground VSS. In the shift register stage as described above, the supply voltage VDD applied to the gate of the pull-down transistor M7 can be set to a threshold voltage $V_{th}$ sufficient to turn on the pull-down transistor M7.

Figure 3:
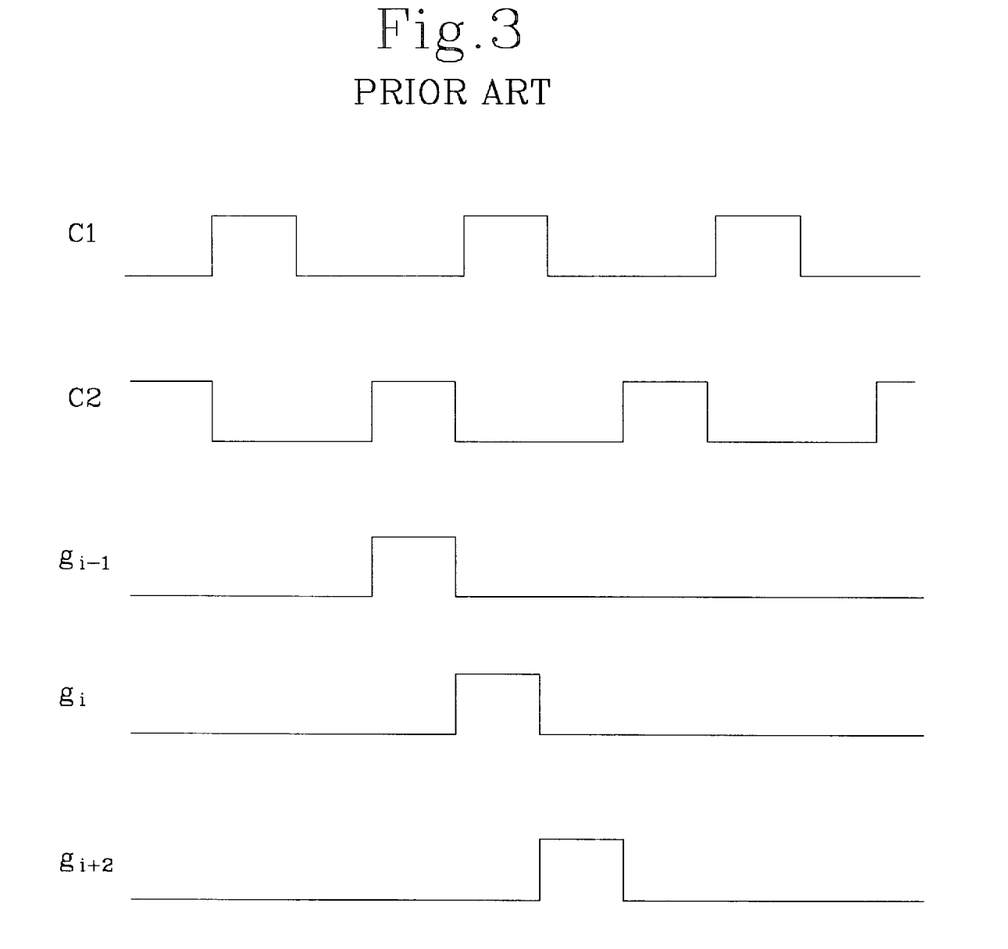
FIG. 3 is a waveform diagram of input and output signals in the conventional shift register stage shown in FIG. 2.

The conventional shift register stage disclosed in U.S. Pat. No. 5,410,583 has disadvantages. In the shift register stage, since an enabled interval of the (i−1) row line signal $g_{i-1}$ overlaps with that of the second clock signal C2, as shown in FIG. 3, four transistors M1, M2, M3, and M4 are turned on at the same time. Accordingly, to provide a sufficiently high voltage to the gate of the pull-up transistor M6, transistor M2 must have a small channel width and transistor M4 must have a large channel width.

Another disadvantage is that the channel width of the pull-up transistor M6 is limited by its gate voltage in addition to a load, (i.e. an impedance of a row line). If the transistor M3 has the same channel width as transistor M4, a voltage supplied to the gate of transistor M2 becomes VDD/2 and thereby reduces the power efficiency of the shift register stage. Finally, since transistors M3 and M4 are turned on at the same time an unnecessary waste of power occurs.

SUMMARY OF THE INVENTION

Accordingly, it is an object of the present invention to provide a scanning circuit that is capable of minimizing the number of input signals as well as rapidly switching a signal applied to row lines of a liquid crystal panel.

To achieve this and other objects of the invention, a scanning circuit according to one aspect of the present invention includes a plurality of cascaded scanning stages, each scanning stage having an input terminal and an output terminal, means for generating phase delayed scanning signals, means for producing an input signal, and output circuitry comprising a push-pull amplifier including pull-up and pull-down transistors having respective conduction paths connected in series with the output terminal thereof and respective control electrodes. The push-pull amplifier has a supply terminal for applying one of the phase delayed scanning signals, input circuitry responsive to a scan pulse applied to the input terminal for generating first and second control signals which are coupled to the control electrodes of the pull-up and pull-down transistors for conditioning the push-pull amplifier to provide output scan pulses, and means for raising a voltage of the first control signal to be applied to the control electrode of the pull-up transistor.

According to another aspect of the present invention, each scanning stage includes output circuitry comprising a push-pull amplifier including pull-up and pull-down transistors having respective conduction paths connected in series with the output terminal thereof and respective control electrodes, the push-pull amplifier having a supply terminal for applying one of the phase delayed scanning signals, input circuitry responsive to a scan pulse applied to the input terminal for generating first and second control signals which are coupled to the control electrodes of the pull-up and pull-down transistors for conditioning the push-pull amplifier to provide output scan pulses, and means for accelerating a tuming-off speed of the pull-down transistor.

According to still another aspect of the present invention, each scanning stage includes output circuitry comprising a push-pull amplifier including pull-up and pull-down transistors having respective conduction paths connected in series with the output terminal thereof and respective control electrodes, the push-pull amplifier having a supply terminal for applying one of the phase delayed scanning signals, input circuitry responsive to a scan pulse applied to the input terminal for generating first and second control signals which are coupled to the control electrodes of the pull-up and pull-down transistors for conditioning the push-pull amplifier to provide output scan pulses, and means for supplementing a potential to the control electrode of the pull-down transistor during a time interval at which the pull-up transistor is turned off.

BRIEF DESCRIPTION OF THE DRAWINGS

The objects of the invention will be apparent from the following detailed description of the embodiments of the present invention with reference to the accompanying drawings, in which.

DETAILED DESCRIPTION OF THE PREFERRED EMBODIMENT

Figure 4:
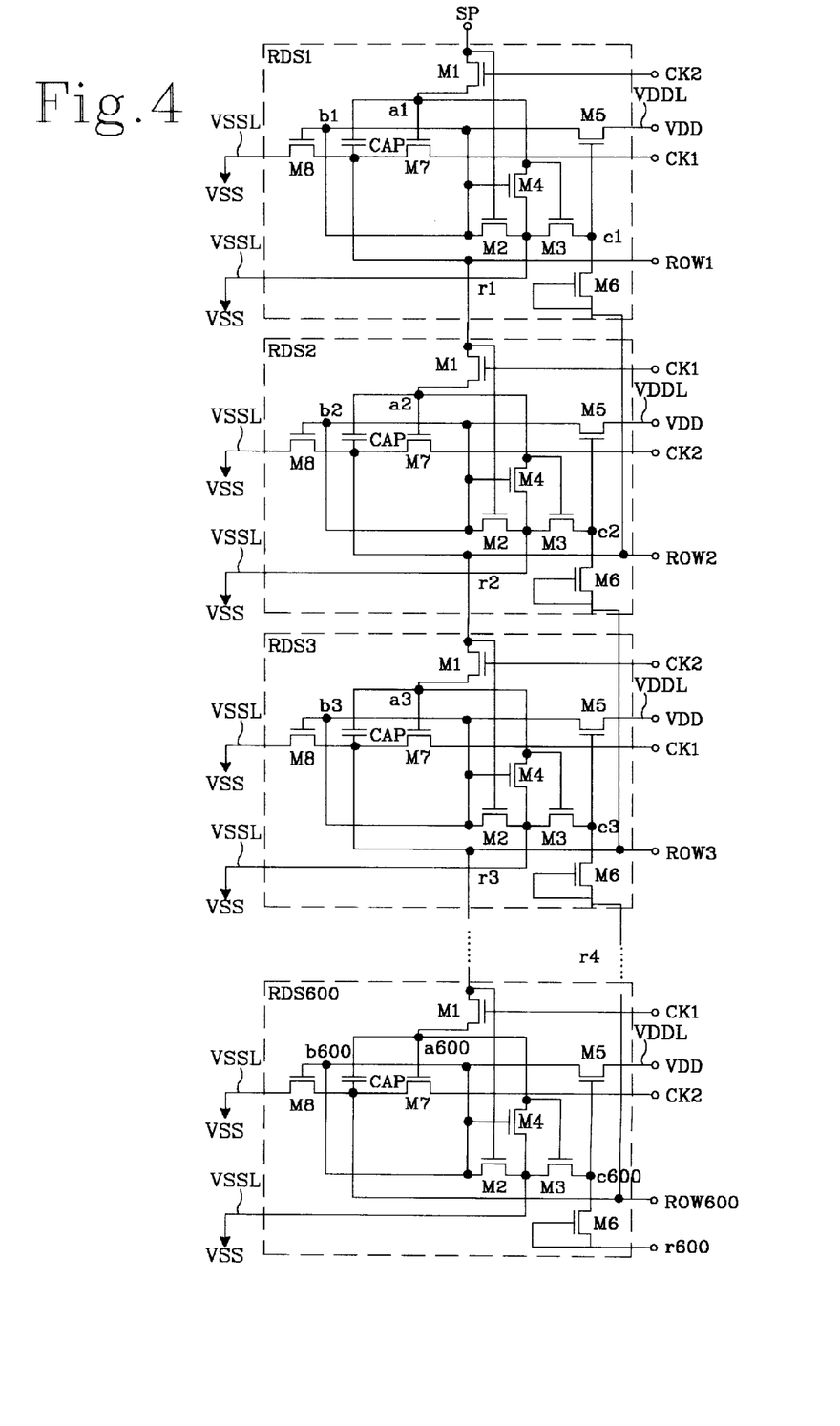
FIG. 4 is a circuit diagram showing a configuration of a scanning circuit according to an embodiment of the present invention.

A scanning circuit according to a preferred embodiment of the present invention is shown in detail in FIG. 4. This scanning circuit includes 600 row line driver stages RDS1 to RDS600 cascade-connected to a scanning pulse input line for driving 2400' 600 pixel arrays. Output lines r1 to r600 of the row line driver stages RDS1 to RDS600 and row lines ROW 1 to ROW 600 are included in the pixel arrays, respectively.

Output signals of the row line driver stages RDS1 to RDS600 are applied to the post row line driver stages RDS2 to RDS601, respectively, and at the same time, are fed back into the row line driver stages RDS1 to RDS600, respectively. Input signals, including the scanning pulse, SP; voltage signals, including supply voltage, VDD; ground voltage, VSS; and first and second clock signals, CK1 and CK2, are applied from an exterior driving system (not shown).

Figure 5:
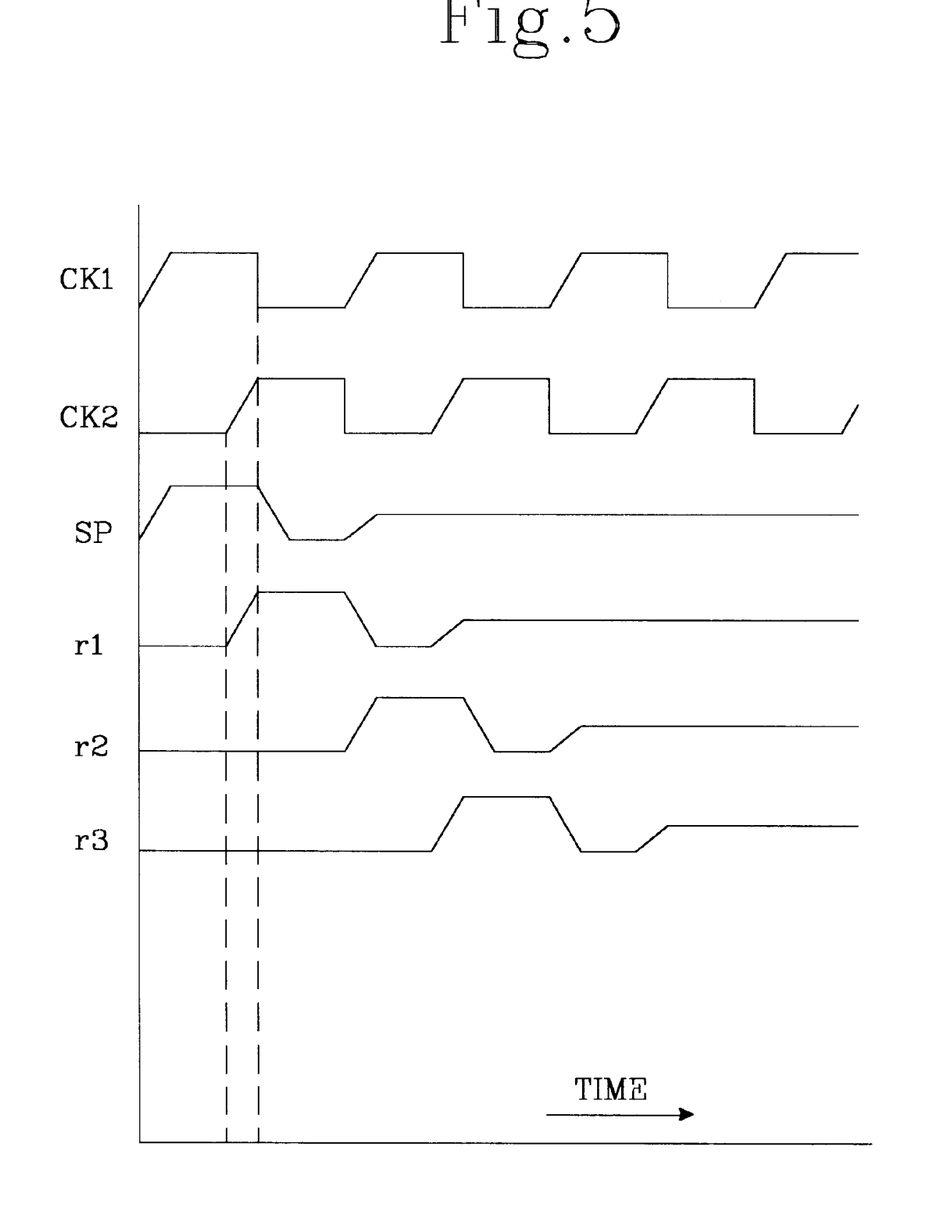
FIG. 5 is a waveform diagram of input and output signals in the row line driver stages according to the invention.

As shown in FIG. 5, odd-numbered row line driver stages RDS1 RDS3, . . . , RDS599 charge a voltage onto row lines ROW 1, ROW 3, . . . , ROW 599, respectively, while the first clock signal CK1 is enabled or is maintaining a high logic state. Even-numbered row line driver stages RDS2, RDS4, . . . , RDS600 charge a voltage onto row lines ROW 2, ROW 4, . . . , ROW 600, respectively, while the first clock signal CK1 is disabled and while the second clock signal CK2 is enabled.

Each odd-numbered row line driver stage RDS1, RDS3, . . . , RDS599 includes a pull-up transistor M7 for receiving the first clock signal CK1. Each even-numbered row line driver stage RDS2, RDS4, . . . , RDS600 includes a pull-up MOS transistor M7 for receiving the second clock signal CK2. Thus, the row line driver stages RDS1 to RDS600 are sequentially driven as the logical state of clock signals CK1 and CK2 is continuously inverted.

Accordingly, row lines ROW 1 to ROW 600 are sequentially enabled for every time interval corresponding to a half period of clock signals CK1 and CK2, as shown in FIG. 5. In other words, output signals rs1 to rs600 of the row line driver stages RDS1 to RDS60 are sequentially enabled into a high logic stage by the half periods of clock signals CK1 and CK2, once a scanning pulse SP is enabled.

As shown in FIG. 4, each odd-numbered row line driver stage RDS1, RDS3, . . . , RDS599 includes a capacitor CAP connected between a first nod and a pull-up transistor M7 connected among the first node ai, the first clock signal line CK1 and the output line ri. Each odd-numbered stage includes a pull-down transistor M8 connected among a second node bi, the output line ri, and the ground voltage line VSS.

The pull-up transistor M7 is turned on by a high level of the (i−1) row line signal applied from an output line r(i−1) of the (i−1) row line driver stage RDS(i−1). The (i−1) row line signal is applied via the first transistor M1 and the first node ai to the gate thereof, thereby transferring a high level of the first clock signal CK1 applied to the drain thereof onto the output line ri. Then, the first transistor M1 transfers an output signal of the (i–1) row line driver stage RDS(i–1) onto the first node ai during an interval when the second clock signal CK2 applied to the gate thereof remains at a high logic state.

The capacitor CAP raises a voltage on the first node ai by the voltage level of the first clock signal CK1 when a high level of the first clock signal CK1 is applied to the output line ri. By increasing a gate voltage by means of the capacitor CAP, the pull-up transistor M7 delivers the high level of the first clock signal CK1 into the output line ri rapidly, and the channel width of the pull-up transistor M7 is set properly in accordance with an impedance of the row line ROW i. The capacitor CAP may be replaced by a parasitic capacitance existing in the pull-up transistor M7.

The second transistor M2 discharges a voltage charged onto the second node bi into the ground voltage line VSSL, during an interval when an output signal of the (i–1) row line driver stage RDS(i–1) remains at a high logic or level state, thereby turning off the pull-down transistor M8. The third transistor M3 discharges a voltage charged onto the third node ci into the ground voltage line VSSL, during an interval when a voltage above the threshold voltage $V_{th}$ is supplied from the first node ai to the gate thereof, thereby turning off the fifth transistor M5.

Meanwhile, the pull-down transistor M8 is turned on during a time interval when an output signal of a post (e.g., (i+1) or (i+2)) row line driver stage RDS(i+1) or RDS(i+2) has a high logic state. For example, this occurs during a time interval range from a rising edge in an output signal of the post row line driver stage RDS(i+1) or RDS(i+2) to a rising edge in an output signal of the (i–1) row line driver stage RDS(i–1), thereby discharging a voltage on the output line ri into the ground voltage line VSSL.

More specifically, a high level of output signal of the post row line driver stage RDS(i+1) or RDS(i+2) is applied, to the gate of the fifth transistor M5 via the sixth transistor M6 and the third node ci. The fifth transistor M5 supplies a high level of supply voltage VDD from the supply voltage line VDDL to the second node bi by a high level of voltage on the third node ci. Then, the pull-down transistor M8 is turned on by the high level signal applied from the second node bi to the gate thereof to discharge a voltage charged onto the output line ri into the ground voltage line VSS.

At this time, the fourth transistor M4, discharges a voltage signal on the first node ai, in response to a voltage signal on the second node bi. Specifically, a voltage signal is charged onto the capacitor CAP into the ground voltage line VSSL, thereby turning off the pull-up transistor M7. The first row line driver stage RDS1 receives a scanning pulse SP instead of an output signal of the (i–1) row line driver stage RDS(i–1). This scanning pulse has a high logic pulse corresponding to a half period of the clock signals CK1 and CK2 for each frame interval.

Each even-numbered row line driver stage RDS2, RDS4, . . . , RDS600 has a configuration similar to each odd-numbered row line driver stage RDS1, RDS3, . . . , RDS599, and operates in a similar manner. One difference is the timing of the first clock signal CK1 and the second clock signal CK2.

Figure 6:
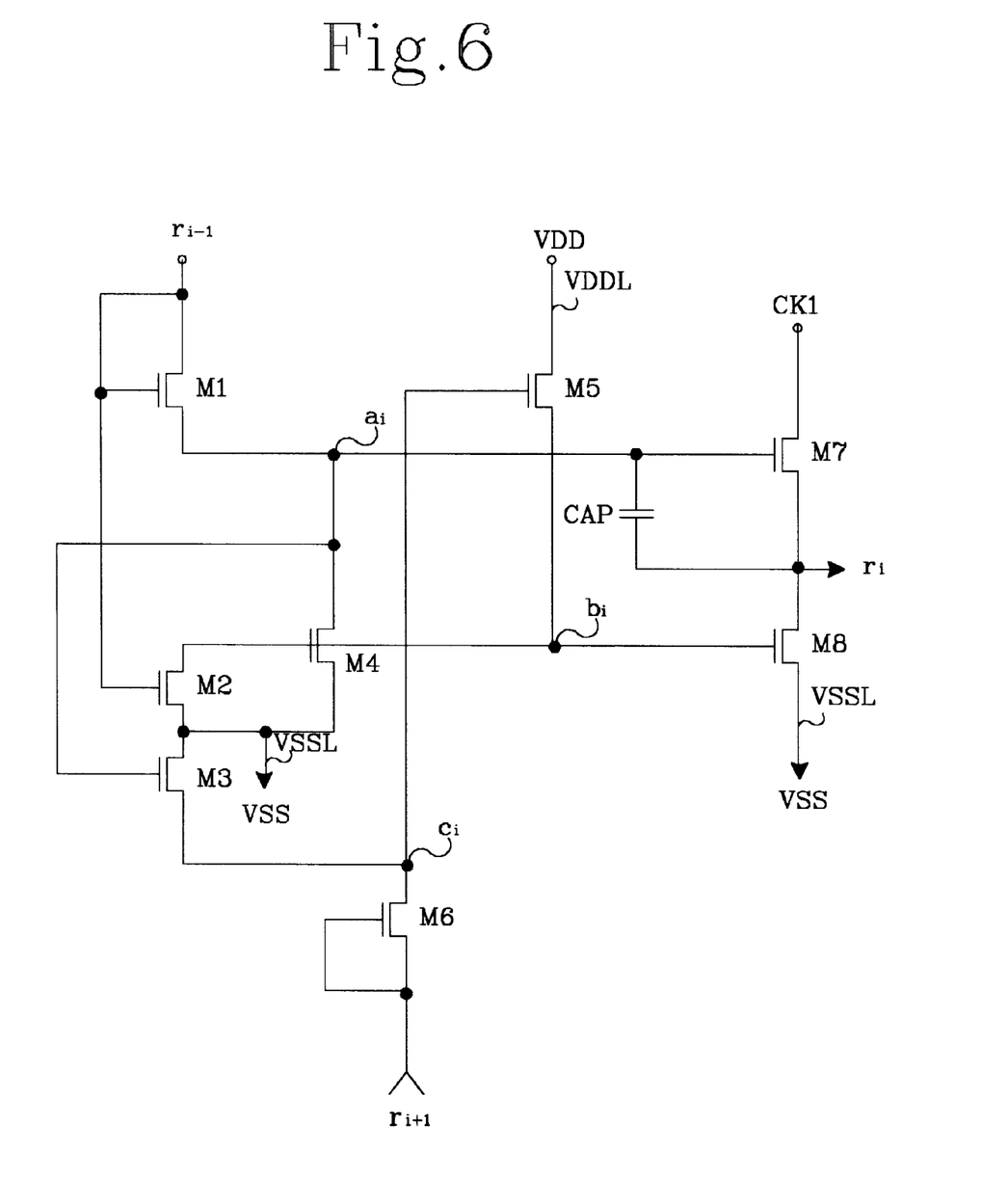
FIG. 6 is a circuit diagram showing a second embodiment of a row line driver stage according to the invention.

Referring to FIG. 6, a second embodiment of the circuit of the row line driver stage RDSi, according to the invention, is shown. The second embodiment has the same circuit configuration as the first embodiment of a row line driver stage RDSi shown in FIG. 4 with the exception that the drain and gate of the first transistor M1 is connected to the output line r(i–1) of the front (i.e., (i–1)) row line driver stage RDS(i–1). The first transistor M1 functions as a uni-directional signal transfer device (i.e., diode) that transfers a high level of output signal r(i–1) from the front row line driver stage RDS(i–1) to the first node ai, or as a current limiting resistor. Due to the first transistor M1 arrangement, the second embodiment uses only a single clock signal, either CK1 or CK2. Accordingly, the wiring structure of the scanning circuit can be simplified.

Figure 7:
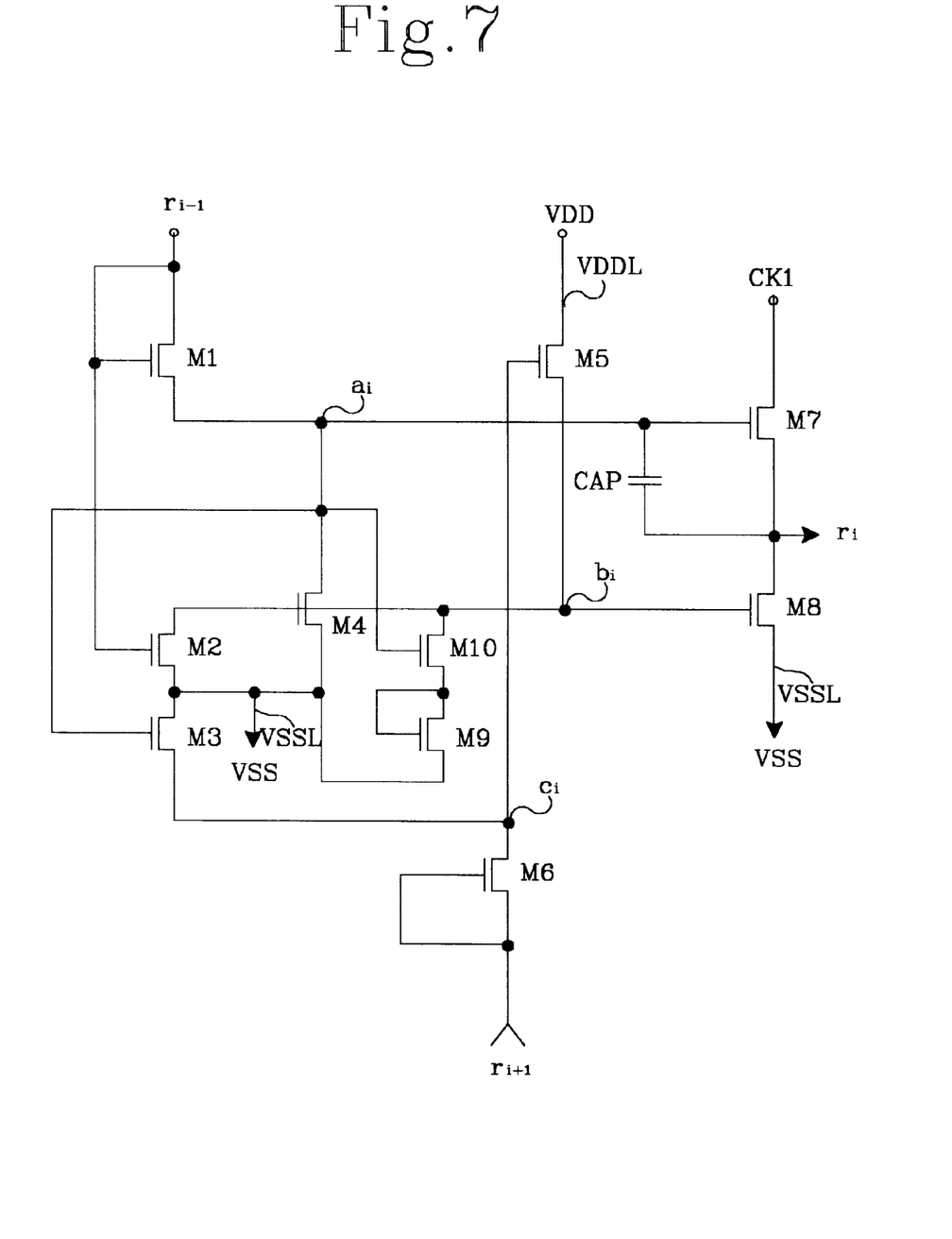
FIG. 7 is a circuit diagram showing a third embodiment of a row line driver stage according to the invention.

Referring to FIG. 7, a third embodiment of the circuit of a row line driver stage RDSi is shown. The third embodiment includes a ninth transistor M9 connected between a second node bi and a ground voltage line VSSL. This embodiment also includes a tenth transistor M10 for switching a current path of the ninth transistor M9 in accordance with a voltage signal on the first node ai.

The tenth transistor M10 connects the ninth transistor M9 to a second node bi during a time interval at which a voltage signal supplied from the first node ai to its gate has a high level. More specifically, the tenth transistor M10 connects the ninth transistor M9 to the second node bi when first and second transistors M1 and M2 are turned on. Then, a voltage on the first node ai arrives at its threshold voltage $V_{th}$ by way of a capacitor CAP.

As the tenth transistor M10 is turned on, the ninth transistor M9 is connected with the second transistor M2 in parallel to discharge rapidly a voltage on the second node bi. The ninth transistor M9 enlarges the amount of current flowing from the second node bi to the ground voltage line VSSL. At this time, a current passing from the output line ri to the pull-down transistor M8 decreases slowly. However, the current decreases suddenly when the tenth transistor M10 is turned on. As a result, a voltage signal on the output line ri suddenly increases when the pull-up transistor M7 is turned on.

When an output signal of the front row line driver stage RDS(i–1) is applied, but a high level of supply voltage VDD is not supplied to the second node bi, the tenth transistor M10 is turned on by a high level signal from the first node ai to connect the ninth transistor M9 to the second node bi. The ninth transistor M9 reduces a voltage on the second node bi by the operation voltage $V_{th}$ of transistor. Accordingly, the pull-down transistor M8 does not deteriorate because its gate voltage is kept low during a discharging interval of voltage on the output line ri.

The third embodiment of the invention can switch a voltage on the output line ri rapidly with the aid of the ninth and tenth transistors M9 and M10. Accordingly, the pull-down transistor M8 does not deteriorate due to the use of the ninth and tenth transistors M9 and M10.

Figure 8:
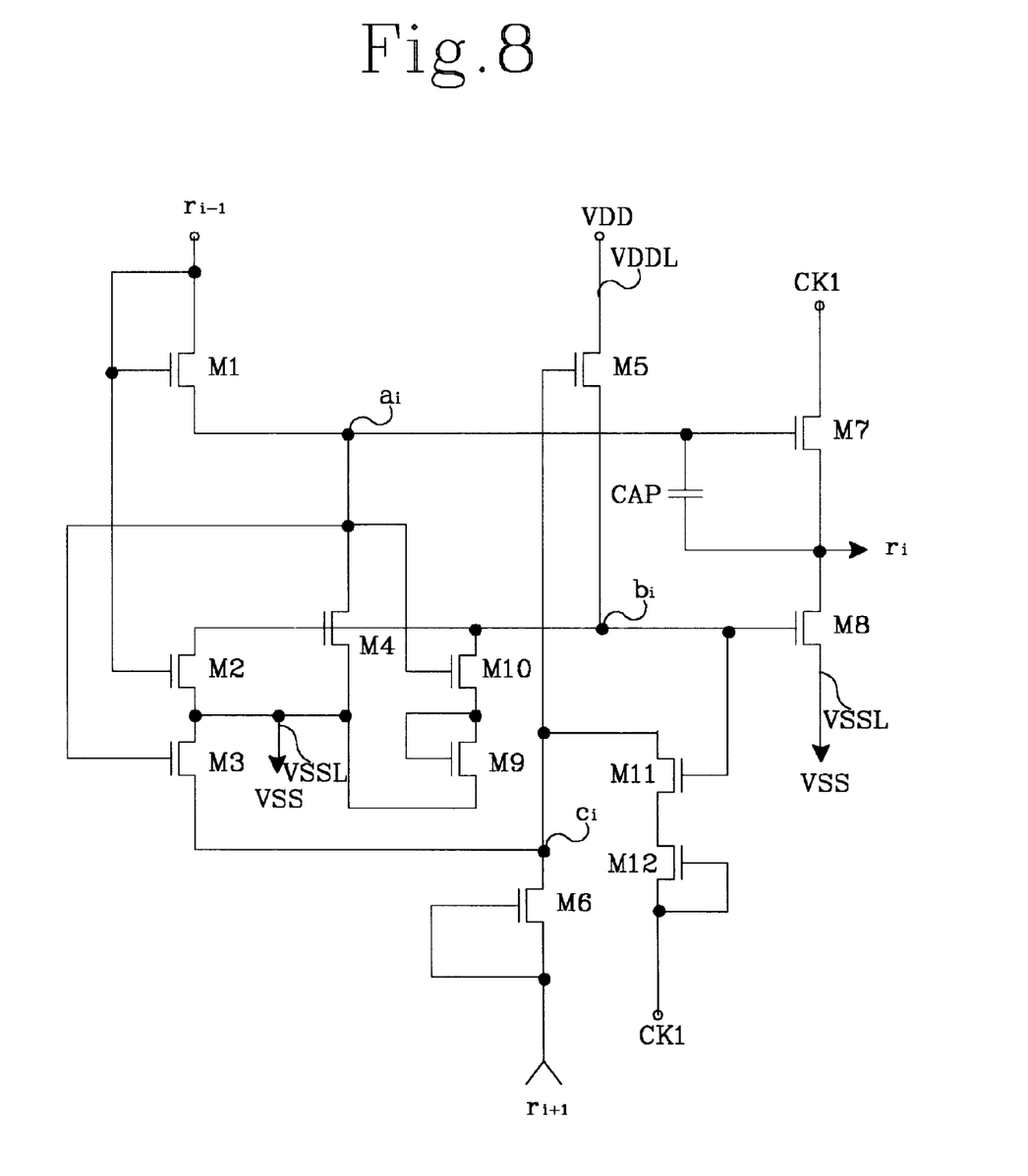
FIG. 8 is a circuit diagram showing a fourth embodiment of a row line driver stage according to the invention.

Referring to FIG. 8, a fourth embodiment of the circuit for a row line driver stage RDSi is shown. Overall, the fourth embodiment has similar structure to the third embodiment previously described. The fourth embodiment includes an eleventh transistor M11 connected between a third node ci and a clock line CK1 or CK2. This embodiment further includes a twelfth transistor M12 for switching a current path of the eleventh transistor M11 in response to a voltage signal of a second node.

The eleventh transistor M11 connects the twelfth transistor M12 to the third node ci during a time interval at which a voltage signal applied from the second node bi to its gate has a high level. In this case, a high level voltage clock signal CK1 or CK2 is periodically applied to the gate of the fifth transistor M5 via the eleventh transistor M11, the twelfth transistor M12, and the third node ci. Thus, in response to a voltage signal on the third node ci, the fifth transistor M5 supplies a high level of supply voltage VDD to the second node bi, thereby allowing the pull-down transistor M8 to maintain a stable turned-on state. As a result, the row line driver stage RDSi, according to the fourth embodiment, prevents an occurrence of a floating signal in the output line ri.

Figure 9:
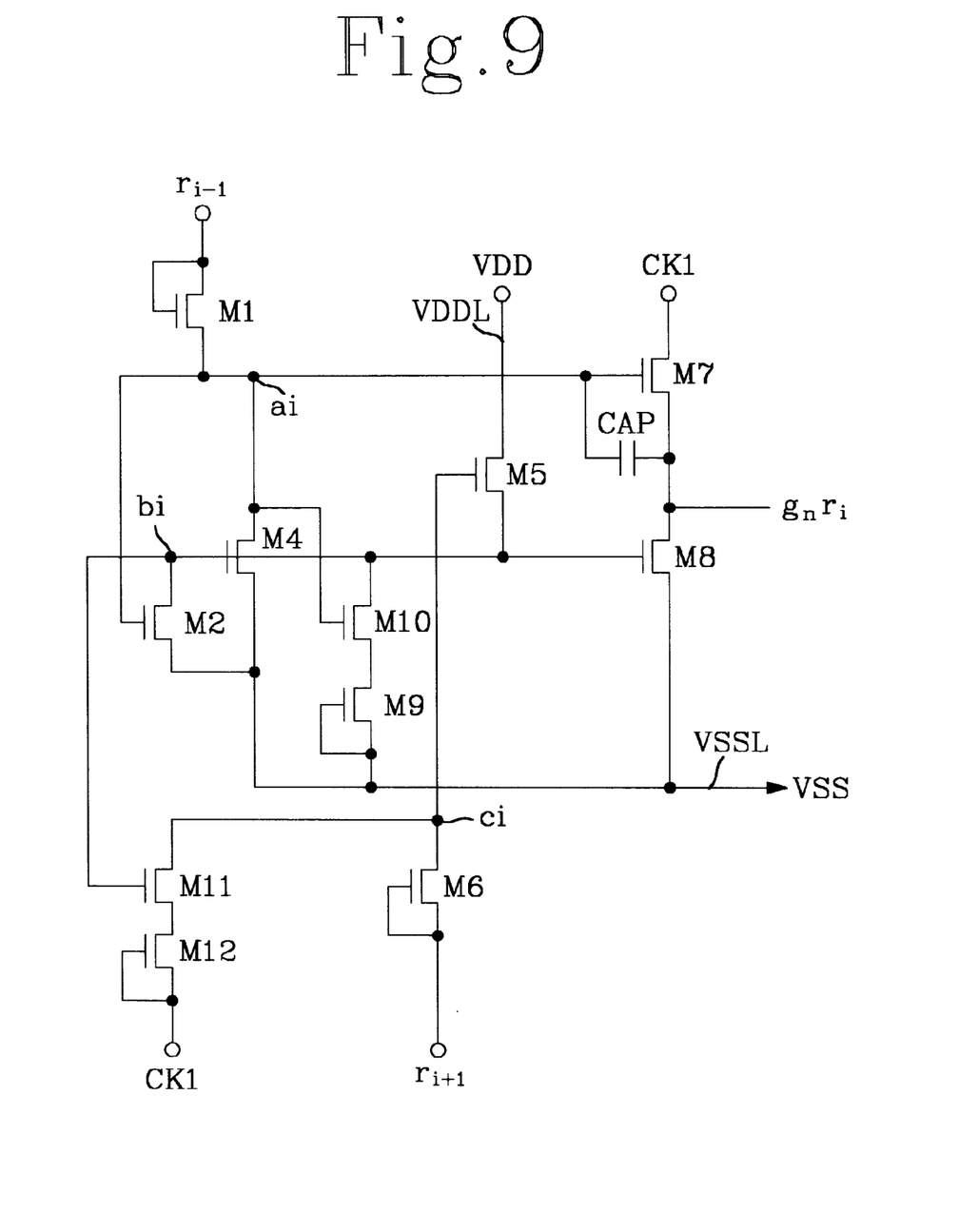
FIG. 9 is a circuit diagram showing a fifth embodiment of a row line driver stage according to the invention.

Referring to FIG. 9, a fifth embodiment of the circuit of a row line driver stage RDSi is shown. The row line driver stage RDSi in this embodiment has a similar circuit configuration as the fourth embodiment. One difference is that the third transistor M3, arranged between the first and third nodes ai and ci, and the ground voltage source VSS, as shown in the fourth embodiment, are eliminated. Another difference is that the gate of the second transistor M2 is responsive to the voltage signal on the first node ai rather than the output signal rs(i–1) of the (i–1) row line driver stage RDS(i–1).

Accordingly, in the fifth embodiment, the second transistor M2 and the fourth transistor M4 make a circular loop between the first and second nodes ai and bi. The transistors M2 and M4 change voltage signals on the first and second nodes ai and bi complementarily. As a result, the pull-up transistor M7 responsive to the voltage signal on the first node ai and the pull-down transistor M8 responsive to the voltage signal on the second node bi operate adaptively with respective to each other. Thus, the ranges of threshold voltages $V_{th}$ in the pull-up transistor M7 and the pull-down transistor M8 become large and, at the same time, the operation of the row line driver stages stabilizes.

Figure 10:
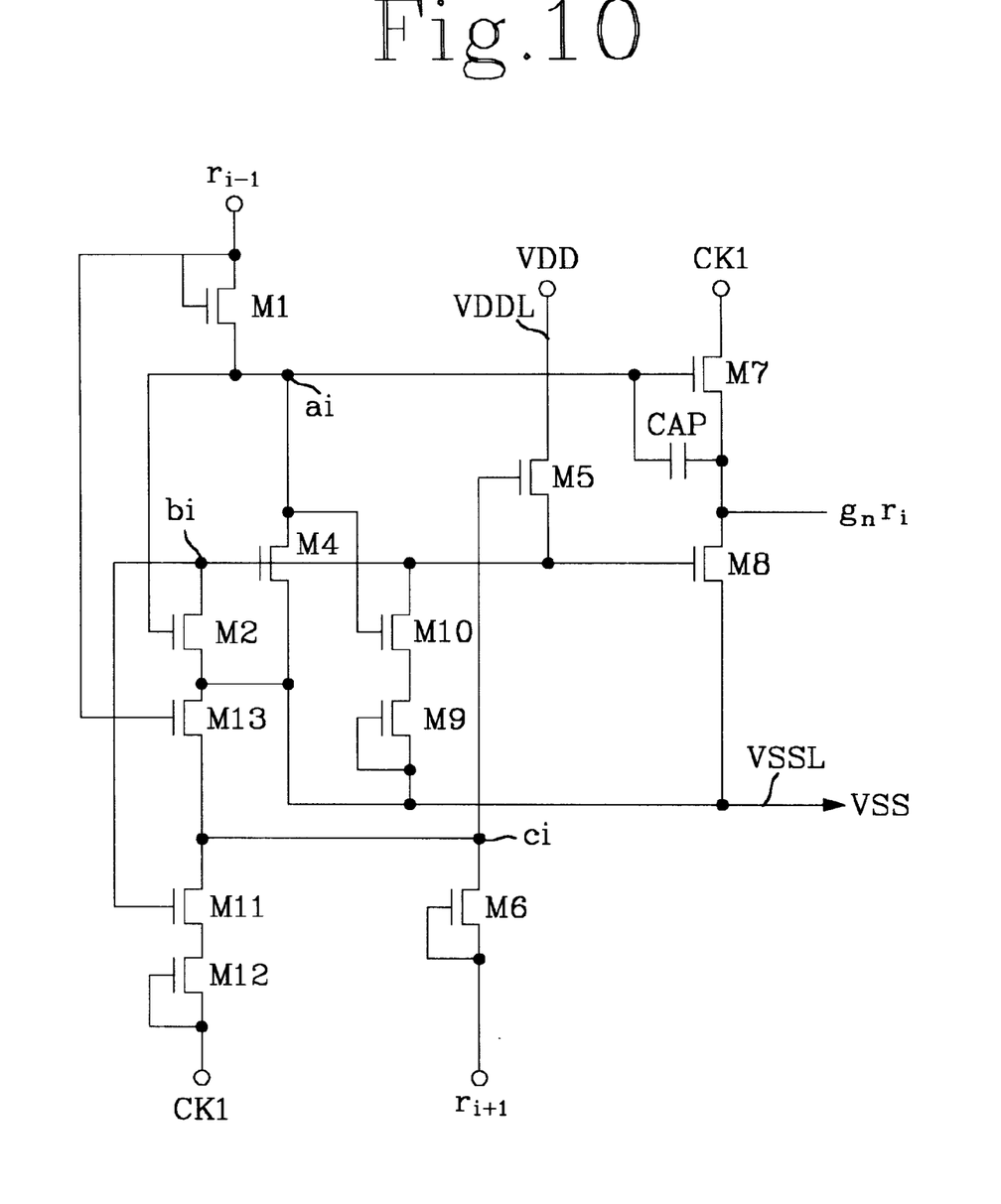
FIG. 10 is a circuit diagram showing a sixth embodiment of a row line driver stage according to the invention.

Referring to FIG. 10, a sixth embodiment of the circuit of a row line driver stage RDSi is shown. The row line driver stage RDSi in this embodiment has a similar circuit configuration as the fifth embodiment. One difference is that the thirteenth transistor M13 connected between the output line r(i–1) of the (i–1) row line driver stage RDS(i–1), the third node ai and the ground voltage source VSS, is add.

In the sixth embodiment, the thirteenth transistor M13 discharges a voltage charged onto the third node ci into the ground voltage line VSSL, during an interval supplied a voltage above the threshold voltage $V_{th}$ from the output line r(i–1) of the (i–1) row line driver stage RDS(i–1) to the gate thereof, thereby turning off the fifth transistor M5. As a result, the pull-down transistor M8 is rapidly turned-off in response to output signal of the (i–1) row line driver stage RDS(i–1), furthermore the responsive speed of the row line driver stages is enhanced.

Figure 11:
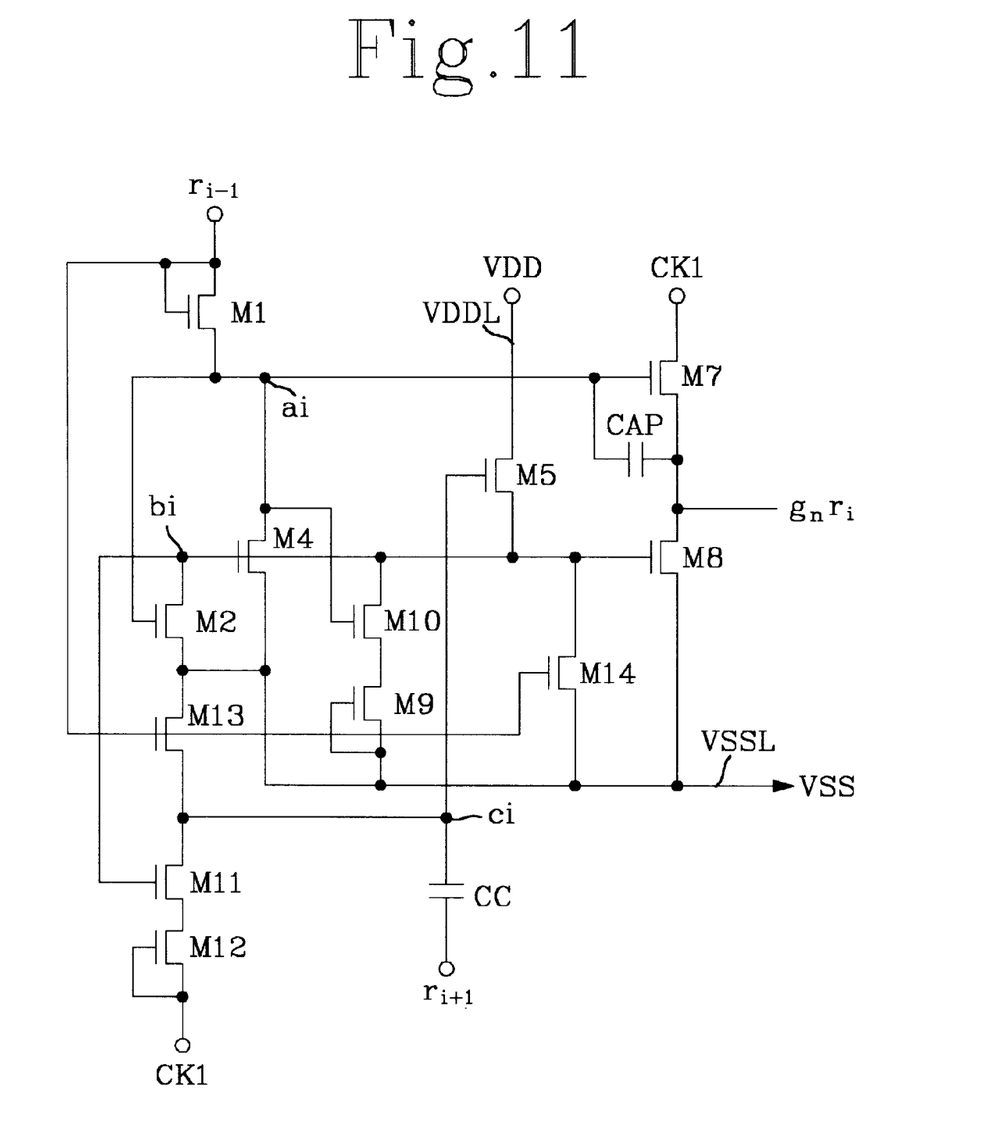
FIG. 11 is a circuit diagram showing a seventh embodiment of a row line driver stage according to the invention.

Referring to FIG. 11, a seventh embodiment of the circuit of a row line driver stage RDSi is shown. The row line driver stage RDSi in this embodiment has a similar circuit configuration as the sixth embodiment. One difference is that a fourteenth transistor M14 and a coupling capacitor CC are add. The fourteenth transistor M14 is arranged between the second node bi , the ground voltage line VSSL and the output line r(i–1) of the (i–1) row line driver stage RDS(i–1), and the coupling capacitor CC connected between the third node ci and the output line r(i+1) of the (i+1) row line driver stage RDS(i+1).

In the seventh embodiment, the fourteenth transistor M14 discharges a voltage charged onto the second node bi into the ground voltage line VSSL, during an interval supplied a voltage above the threshold voltage $V_{th}$ from the output line r(i–1) of the (i–1) row line driver stage RDS(i–1) to the gate thereof, thereby turning off the pull-down transistor M8 regardless to the voltage signal from the output line r(i+1) of the (i+1) row driver stage RDS(i+1). As a result, the row line driver stage RDSi responds accurately to the voltage signal from the output line r(i–1) of the (i–1) row line driver stage RDS(i–1) in test mode that both of the output line r(i–1) of the (i–1) row line driver stage RDS(i–1) and the output line r(i+1) of the (i+1) row driver stage RDS(i+1) are supplied the voltage signals.

According to this embodiment, a gate voltage of a pull-up transistor is raised by a capacitor. As a result, a high level voltage signal is transferred to an output line rapidly and a channel width of the transistors can be set to the same size. Moreover, a channel width of the pull-up transistor can be established based on a load (i.e. an impedance in row lines of a liquid crystal.)

A voltage signal of the output line may be switched more rapidly by increasing a reduction speed in the amount of current passing through a pull-down transistor when a pull-up transistor is turned on. Also, the present invention is capable of preventing deterioration of a pull-down transistor by reducing the gate voltage of the pull-down transistor by controlling the operation voltage thereof when the pull-down transistor is turned on.

It is noted that the preferred transistors used in the invention are the NMOS type. However, MOS transistors or any other suitable transistor may be used.

Further, according to the present invention, it is possible to prevent the generation of a floating signal in the output line by periodically supplementing a gate voltage of the pull-down transistor. The pull-up and pull-down transistors are responsive to each other, thereby enlarging the range of threshold voltages in the transistors and permitting stable operation of the row line driver stages.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A scanning circuit comprising a plurality of cascaded scanning stages, each of the scanning stages having an input terminal and an output terminal, the scanning circuit including means for generating phase delayed scanning signals and means for receiving an input signal, the scanning stages comprising:

output circuitry comprising a push-pull amplifier including a pull-up transistor and a pull-down transistor having respective conduction paths connected in series with the output terminal, the pull-up transistor having a control electrode and the pull-down transistor having a control electrode, the push-pull amplifier having a supply terminal for receiving one of the phase delayed scanning signals;

input circuitry responsive to a scanning pulse applied to the input terminal for generating first and second control signals that are respectively coupled to the control electrodes of the pull-up transistor and a pull-down transistor for conditioning the push-pull amplifier to provide output scanning pulses; and means responsive to a signal at the output terminal for raising a voltage of the first control signal to be applied to the control electrode of the pull-up transistor.

2. The scanning circuit as set forth in claim 1, wherein the input circuitry includes a first transistor having a conduction path connected to the control electrode of the pull-up transistor, and a control electrode and a first electrode that are connected to the input terminal; and a second transistor having a conduction path coupled in series with the conduction path of the first transistor and connected to the control electrode of the pull-up transistor.

3. The scanning circuit as set forth in claim 2, wherein the input circuitry further includes a third transistor having a conduction path connected to the control electrode of the pull-down transistor and a control electrode connected to the input terminal; and a fourth transistor having a conduction path coupled in series with the conduction path of the third transistor and the control electrode of the pull-down transistor, and a control electrode connected to the output terminal of a subsequent cascaded stage.

4. The scanning circuit as set forth in claim 3, further comprising means for supplementing a potential to the control electrode of the pull-down transistor periodically during a time interval at which the pull-up transistor is turned off.

5. The scanning circuit as set forth in claim 4, wherein the potential supplementing means includes a fifth transistor having a conduction path connected between the control electrode of the fourth transistor and the supply terminal, and a control electrode connected to the control electrode of the pull-down transistor.

6. The scanning circuit as set forth in claim 3, further comprising means for accelerating a turning-off speed of the pull-down transistor.

7. The scanning circuit as set forth in claim 6, wherein the accelerating means includes a fifth transistor having a conduction path coupled in parallel with the conduction path of the third transistor, and a control electrode connected to the control electrode of the pull-up transistor.

8. The scanning circuit as set forth in claim 7, wherein the accelerating means further includes a sixth transistor having a conduction path cascade-connected to the conduction path of the fifth transistor, and a control electrode connected to the conduction path of the fifth transistor.

9. The scanning circuit as set forth in claim 1, wherein the input circuitry includes a diode having a conduction path connected between the input terminal and the control electrode of the pull-up transistor, and an electrode connected to the input terminal; and a transistor having a conduction path coupled in series with the conduction path of the diode and connected to the control electrode of the pull-up transistor.

10. The scanning circuit as set forth in claim 1, wherein the voltage raising means includes a capacitor connected to the output terminal and the control electrode of the pull-up transistor.

11. A scanning circuit comprising a plurality of cascaded scanning stages, each of the scanning stages having an input terminal and an output terminal, the scanning circuit including means for generating phase delayed scanning signals and means for receiving an input signal, the scanning stages comprising:

output circuitry comprising a push-pull amplifier including a pull-up transistor and a pull-down transistor having respective conduction paths connected in series with the output terminal and respective control electrodes, the push-pull amplifier having a supply terminal for receiving one of the phase delayed scanning signals;

input circuitry responsive to a scanning pulse applied to the input terminal for generating first and second control signals that are coupled to the control electrodes of the pull-up and pull-down transistors for conditioning the push-pull amplifier to provide output scanning pulses; and means for accelerating a turning-off speed of the pull-down transistor by discharging a voltage at the control electrode of the pull-down transistor selectively in one of two paths.

12. The scanning circuit as set forth in claim 11, wherein the input circuitry includes a first transistor having a conduction path connected to the control electrode of the pull-up transistor, and a control electrode and a first electrode that are connected to the input terminal; and a second transistor having a conduction path coupled in series with the conduction path of the first transistor and connected to the control electrode of the pull-up transistor.

13. The scanning circuit as set forth in claim 12, wherein the input circuitry further includes a third transistor having a conduction path connected to the control electrode of the pull-down transistor and a control electrode connected to the input terminal; and a fourth transistor having a conduction path coupled in series with the conduction path of the third transistor and the control electrode of the pull-down transistor, and a control electrode connected to the output terminal of one of the plurality of cascaded stages.

14. The scanning circuit as set forth in claim 13, further comprising means for supplementing a potential to the control electrode of the pull-down transistor periodically during a time interval at which the pull-up transistor is turned off.

15. The scanning circuit as set forth in claim 14, wherein the potential supplementing means includes a fifth transistor having a conduction path connected between the control electrode of the fourth transistor and the supply terminal, and a control electrode connected to the control electrode of the pull-down transistor.

16. The scanning circuit as set forth in claim 13, wherein the accelerating means includes a fifth transistor having a conduction path coupled in parallel with the conduction path of the third transistor, and a control electrode connected to the control electrode of the pull-up transistor.

17. The scanning circuit as set forth in claim 16, wherein the accelerating means further includes a sixth transistor having a conduction path cascade-connected to the conduction path of the fifth transistor, and a control electrode connected to the conduction path of the fifth transistor.

18. The scanning circuit as set forth in claim 11, wherein the input circuitry includes a diode having a conduction path connected between the input terminal and the control electrode of the pull-up transistor, and an electrode connected to the input terminal; and a transistor having a conduction path coupled in series with the conduction path of the diode and connected to the control electrode of the pull-up transistor.

19. A scanning circuit comprising a plurality of cascaded scanning stages, each of said scanning stages having an input terminal and an output terminal, the scanning circuit including means for generating phase delayed scanning signals and means for receiving an input signal, the scanning stages comprising:

output circuitry comprising a push-pull amplifier including a pull-up transistor and a pull-down transistor having respective conduction paths connected in series with the output terminal and respective control electrodes, the push-pull amplifier having a supply terminal for receiving one of the phase delayed scanning signals;

input circuitry responsive to a scanning pulse applied to the input terminal for generating first and second control signals that are coupled to the control electrodes of the pull-up and pull-down transistors for conditioning the push-pull amplifier to provide output scanning pulses; and means for supplementing a potential to the control electrode of the pull-down transistor during a time interval at which the pull-up transistor is turned off.

20. The scanning circuit as set forth in claim 19, wherein the input circuitry includes a first transistor having a conduction path connected to the control electrode of the pull-up transistor, and a control electrode and a first electrode that are connected to the input terminal; and a second transistor having a conduction path coupled in series with the conduction path of the first transistor and connected to the control electrode of the pull-up transistor.

21. The scanning circuit as set forth in claim 20, wherein the input circuitry further includes a third transistor having a conduction path connected to the control electrode of the pull-down transistor and a control electrode connected to the input terminal; and a fourth transistor having a conduction path coupled in series with the conduction path of the third transistor and the control electrode of the pull-down transistor, and a control electrode connected to the output terminal of a subsequent cascaded stage.

22. The scanning circuit as set forth in claim 21, further comprising means for accelerating a turning-off speed of the pull-down transistor.

23. The scanning circuit as set forth in claim 22, wherein the accelerating means includes a fifth transistor having a conduction path coupled in parallel with the conduction path of the third transistor, and a control electrode connected to the control electrode of the pull-up transistor.

24. The scanning circuit as set forth in claim 23, wherein the accelerating means further includes a sixth transistor having a conduction path cascade-connected to the conduction path of the fifth transistor, and a control electrode connected to the conduction path of the transistor.

25. The scanning circuit as set forth in claim 19, wherein the input circuitry includes a diode having a conduction path connected between the input terminal and the control electrode of the pull-up transistor, and an electrode connected to the input terminal; and a transistor having a conduction path coupled in series with the conduction path of the diode and connected to the control electrode of the pull-up transistor.

26. The scanning circuit as set forth in claim 21, wherein the potential supplementing means includes a fifth transistor having a conduction path connected between the control electrode of the fourth transistor and the supply terminal, and a control electrode connected to the control electrode of the pull-down transistor.

* * * * *